United States Patent
Cheng et al.

(10) Patent No.: US 8,835,297 B2
(45) Date of Patent: Sep. 16, 2014

(54) FABRICATING METHOD OF NON-VOLATILE MEMORY STRUCTURE

(71) Applicant: MACRONIX International Co., Ltd., Hsinchu (TW)

(72) Inventors: Chih-Chieh Cheng, Hsinchu (TW); Shih-Guei Yan, Hsinchu (TW); Wen-Jer Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/750,606

(22) Filed: Jan. 25, 2013

(65) Prior Publication Data

US 2014/0209992 A1 Jul. 31, 2014

(51) Int. Cl.
*H01L 21/3205* (2006.01)

(52) U.S. Cl.
USPC ........... 438/593; 438/216; 438/261; 438/257; 438/591; 257/315; 257/324; 257/326

(58) Field of Classification Search
USPC .................. 438/261–264, 257–259, 593; 257/314–315, 324–326
See application file for complete search history.

(56) References Cited

U.S. PATENT DOCUMENTS

| | | | | |
|---|---|---|---|---|
| 6,897,517 | B2 * | 5/2005 | Van Houdt et al. | 257/315 |
| 7,026,682 | B2 * | 4/2006 | Chung | 257/314 |
| 7,700,426 | B2 * | 4/2010 | Kim et al. | 438/201 |
| 8,466,508 | B2 * | 6/2013 | Ku et al. | 257/324 |
| 2008/0073703 | A1 * | 3/2008 | Kurihara | 257/324 |

* cited by examiner

*Primary Examiner* — Dung A. Le
(74) *Attorney, Agent, or Firm* — J.C. Patents

(57) ABSTRACT

A fabricating method for fabricating a non-volatile memory structure including the following steps is provided. A first conductive type doped layer is formed in a substrate. A plurality of stacked structures is formed on the substrate, and each of the stacked structures includes a charge storage structure. A first dielectric layer is formed on the substrate between the adjacent stacked structures. A second conductive type doped region is formed in the substrate between the adjacent charge storage structures. The second conductive type doped region has an overlap region with each of the charge storage structures. In addition, the second conductive type doped region divides the first conductive type doped layer into a plurality of first conductive type doped regions that are separated from each other. A conductive layer is formed on the first dielectric layer.

10 Claims, 3 Drawing Sheets

FABRICATING METHOD OF NON-VOLATILE MEMORY STRUCTURE

BACKGROUND OF THE INVENTION

1. Field of the Invention

The embodiment of the invention relates to a memory structure and a fabricating method thereof and more particularly relates to a non-volatile memory structure and a fabricating method thereof.

2. Description of Related Art

A memory is a semiconductor device designed for the purpose of storing information or data. As the functionalities of computer microprocessors become more and more powerful, programs and operations executed by the software are increasing correspondingly. As a consequence, the demand for high storage capacity memories is ever increasing. Among various memory products, the non-volatile memory allows repeated programming, reading, and erasure of data. Moreover, the stored data is retained even after power to the memory is removed. In light of the aforementioned advantages, the electrically-erasable programmable read-only memory has become one of the most popular memories in personal computers and other electronic equipment.

A typical non-volatile memory has floating gates and control gates fabricated by using doped polysilicon. As the memory is programmed, electrons injected into the floating gate are uniformly distributed in the entire polysilicon floating gate. However, if the tunnel oxide layer under the polysilicon floating gate has defects, it can easily cause a leakage current in the device and affect the reliability of the device.

Therefore, in order to solve the issue of current leakage in the non-volatile memory, a conventional method utilizes a charge trapping layer to replace the polysilicon floating gate. Another advantage obtained from replacing the polysilicon floating gate with the charge trapping layer is that the electrons are only stored in a portion of the charge trapping layer that is near the top of the source or the drain when the device is programmed. By changing the voltages applied to the control gate and the source region and the drain region at the two sides, a single charge trapping layer can have two groups of electrons with a Gaussian distribution, a single group of electrons with the Gaussian distribution, or no electrons. Accordingly, the non-volatile memory having the charge trapping layer, instead of the floating gate, is a non-volatile memory for storing 2 bits/cell. Generally speaking, data of 2 bits can be respectively stored on the left side (i.e. left bit) or the right side (i.e. right bit) of the charge trapping layer.

However, a flash memory may suffer from a second bit effect. That is, when a reading operation is performed on the left bit, the reading operation is affected by the right bit; or when the reading operation is performed on the right bit, the reading operation is affected by the left bit. In addition, the length of the channel is reduced as the memory is miniaturized, which makes the second bit effect become more obvious and reduce the performance of the memory. Moreover, when the size of the memory is reduced, spacings between the elements therein are shortened as well. As a result, program disturbance may easily occur and impair the reliability of the memory device when a programming operation is performed on the neighboring memory.

SUMMARY OF THE INVENTION

An embodiment of the invention provides a non-volatile memory structure for reducing the second bit effect and program disturbance that are generated during operation.

Another embodiment of the invention provides a fabricating method for fabricating a non-volatile memory structure that has favorable performance and reliability.

An embodiment of the invention provides a non-volatile memory structure, which includes a substrate, a plurality of stacked structures, a plurality of first conductive type doped regions, at least one second conductive type doped region, a conductive layer, and a first dielectric layer. The stacked structures are disposed on the substrate, and each of the stacked structures includes a charge storage structure. The first conductive type doped regions are disposed in the substrate under the corresponding charge storage structures respectively. The second conductive type doped region is disposed in the substrate between the adjacent charge storage structures and has an overlap region with each of the charge storage structures. The conductive layer covers the second conductive type doped region. The first dielectric layer is disposed between the conductive layer and the second conductive type doped region.

According to an embodiment of the invention, in the non-volatile memory structure, each of the charge storage structures includes a second dielectric layer, a charge trapping layer, and a third dielectric layer, which are arranged sequentially from the substrate.

According to an embodiment of the invention, in the non-volatile memory structure, each of the stacked structures further includes a hard mask layer disposed on each of the charge storage structures.

According to an embodiment of the invention, in the non-volatile memory structure, a width of the first conductive type doped region is less than a width of the charge storage structure, for example.

According to an embodiment of the invention, in the non-volatile memory structure, a dopant concentration of the second conductive type doped region is greater than a dopant concentration of the first conductive type doped region, for example.

According to an embodiment of the invention, in the non-volatile memory structure, a dopant depth of the second conductive type doped region is greater than a dopant depth of the first conductive type doped region, for example.

According to an embodiment of the invention, in the non-volatile memory structure, a ratio of a width of the overlap region to the width of the charge storage structure is in a range of 1:30 to 1:5, for example.

According to an embodiment of the invention, in the non-volatile memory structure, the width of the overlap region is 30 to 150 Å, for example.

According to an embodiment of the invention, in the non-volatile memory structure, the conductive layer further covers the stacked structures.

According to an embodiment of the invention, in the non-volatile memory structure, the first dielectric layer is further disposed between the stacked structures and the conductive layer.

Another embodiment of the invention provides a fabricating method for fabricating a non-volatile memory structure, and the fabricating method includes the following steps. A first conductive type doped layer is formed in a substrate. A plurality of stacked structures is formed on the substrate, and each of the stacked structures includes a charge storage structure. A first dielectric layer is formed on the substrate between the adjacent stacked structures. A second conductive type doped region is formed in the substrate between the adjacent charge storage structures. The second conductive type doped region has an overlap region with each of the charge storage structures. In addition, the second conductive type doped region divides the first conductive type doped layer into a plurality of first conductive type doped regions that are separated from each other. A conductive layer is formed on the first dielectric layer.

According to another embodiment of the invention, in the fabricating method of the non-volatile memory structure, a method for forming the stacked structures includes the following steps. A second dielectric material layer, a charge trapping material layer, and a third dielectric material layer are sequentially formed on the substrate. A patterning process is performed on the third dielectric material layer, the charge trapping material layer, and the second dielectric material layer.

According to another embodiment of the invention, in the fabricating method of the non-volatile memory structure, the method for forming the stacked structures further includes the following steps. A hard mask material layer is formed on the third dielectric material layer. The patterning process is performed on the hard mask material layer.

According to another embodiment of the invention, in the fabricating method of the non-volatile memory structure, a width of the first conductive type doped region is less than a width of the charge storage structure, for example.

According to another embodiment of the invention, in the fabricating method of the non-volatile memory structure, a dopant concentration of the second conductive type doped region is greater than a dopant concentration of the first conductive type doped region, for example.

According to another embodiment of the invention, in the fabricating method of the non-volatile memory structure, a dopant depth of the second conductive type doped region is greater than a dopant depth of the first conductive type doped region, for example.

According to another embodiment of the invention, in the fabricating method of the non-volatile memory structure, a ratio of a width of the overlap region to the width of the charge storage structure is in a range of 1:30 to 1:5, for example.

According to another embodiment of the invention, in the fabricating method of the non-volatile memory structure, the width of the overlap region is 30 to 150 Å, for example.

According to another embodiment of the invention, in the fabricating method of the non-volatile memory structure, the first dielectric layer may cover the stacked structures.

According to another embodiment of the invention, in the fabricating method of the non-volatile memory structure, the second conductive type doped region may be formed after or before forming the first dielectric layer.

Based on the above, in the non-volatile memory structure disclosed in an embodiment of the invention, the charge storage structures used for storing charges are located at two sides of the second conductive type doped region and are separated from each other, and most of the programmed charge distribution is restricted within the charge storage structures in the overlap region. Consequently, the second bit effect and program disturbance that are generated during operation are reduced.

Moreover, the fabricating method of the non-volatile memory structure disclosed in an embodiment of the invention is applicable to fabricating a non-volatile memory that has better performance and reliability.

To make the aforementioned and other features and advantages of an embodiment of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIGS. 1A-1E are schematic cross-sectional views illustrating steps of fabricating a non-volatile memory structure according to an embodiment of the invention.

Figure 1A:
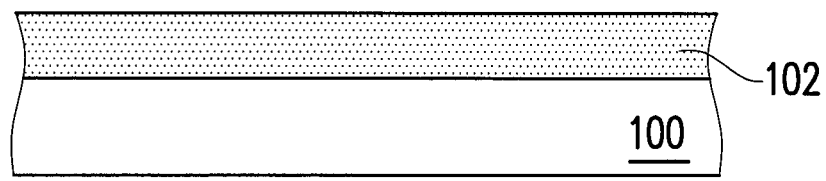
FIGS. 1A-1E are schematic cross-sectional views illustrating steps of fabricating a non-volatile memory structure according to an embodiment of the invention.

First, referring to FIG. 1A, a first conductive type doped layer 102 is formed in a substrate 100. The substrate 100 is, for example, a silicon substrate. The first conductive type doped layer 102 may be an N-type doped region or a P-type doped region. A dopant concentration of the first conductive type doped layer 102 is in a range of $1\,e^{18}\,cm^{-3}$ to $1\,e^{21}\,cm^{-3}$ for example. A dopant depth of the first conductive type doped layer 102 is in a range of 300 Å to 1000 Å, for example. A method for forming the first conductive type doped layer 102 includes an ion implantation method, for example. In this embodiment, the first conductive type doped layer 102 is the N-type doped region, for example, and a dopant used in this embodiment is an N-type dopant, such as As or P.

Figure 1B:
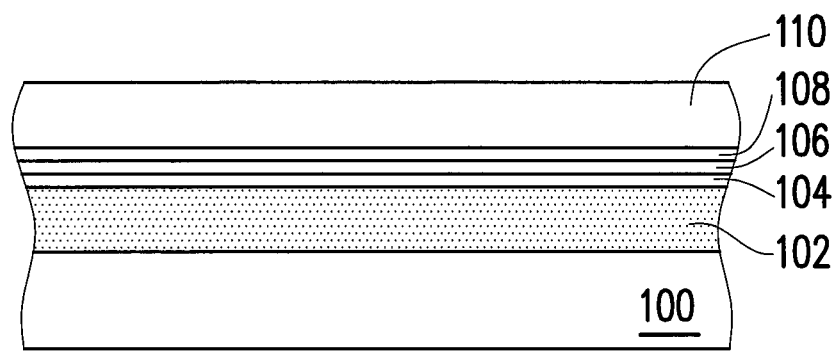

Then, referring to FIG. 1B, a dielectric material layer 104, a charge trapping material layer 106, and a dielectric material layer 108 are formed on the substrate 100 sequentially. A material of the dielectric material layer 104 is silicon oxide, for example. A method for forming the dielectric material layer 104 includes a thermal oxidation method, for example. A material of the charge trapping material layer 106 is silicon nitride, for example. A method for forming the charge trapping material layer 106 includes a chemical vapor deposition method, for example. A material of the dielectric material layer 108 is silicon oxide, for example. A method for forming the dielectric material layer 108 is a thermal oxidation method or a chemical vapor deposition method, for example.

Moreover, a hard mask material layer 110 may be selectively formed on the dielectric material layer 108. A material of the hard mask material layer 110, for example, includes silicon nitride, silicon oxide, or an advanced patterning film (APF) supplied by Applied Materials, Inc. A method for forming the hard mask material layer 110 is, for example, a chemical vapor deposition method.

Figure 1C:
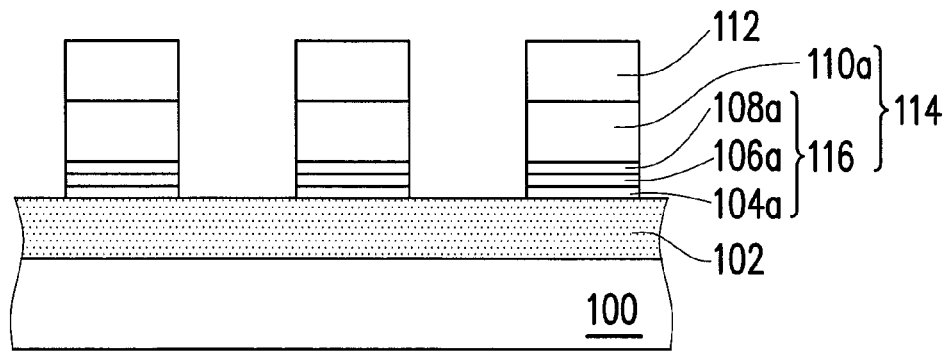

Next, referring to FIG. 1C, a patterned photoresist layer 112 is formed on the hard mask material layer 110. A material of the patterned photoresist layer 112 includes a positive type photoresist material or a negative type photoresist material, for example. The patterned photoresist layer 112 may be fabricated by a lithography process.

Thereafter, the patterned photoresist layer 112 is used as a mask for removing a portion of the hard mask material layer 110, a portion of the dielectric material layer 108, a portion of the charge trapping material layer 106, and a portion of the dielectric material layer 104, so as to form a hard mask layer 110a, a dielectric layer 108a, a charge trapping layer 106a, and a dielectric layer 104a, which form a plurality of stacked structures 114. Each of the stacked structures 114 includes a charge storage structure 116 and may further include the hard mask layer 110a disposed on the charge storage structure 116. The charge storage structure 116 includes the dielectric layer 104a, the charge trapping layer 106a, and the dielectric layer 108a, which are sequentially arranged from the substrate 100. In this embodiment, the stacked structures 114 are formed by patterning the hard mask material layer 110, the dielectric material layer 108, the charge trapping material layer 106, and the dielectric material layer 104. However, a method for forming the stacked structures 114 is not limited to the above.

Figure 1D:
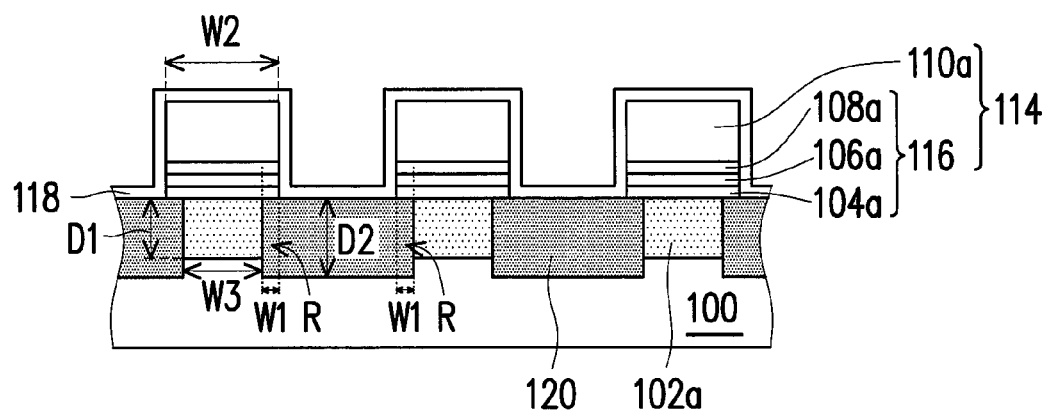

Next, referring to FIG. 1D, the patterned photoresist layer 112 is removed. A method for removing the patterned photoresist layer 112, for example, includes a dry photoresist removing method.

Moreover, a dielectric layer 118 is formed on the substrate 100 between the adjacent stacked structures 114, and the dielectric layer 118 may cover the stacked structures 114. A material of the dielectric layer 118 is silicon oxide, for example. A method for forming the dielectric layer 118 is a thermal oxidation method or a chemical vapor deposition method, for example.

Thereafter, a second conductive type doped region 120 is formed in the substrate 100 between the adjacent charge storage structures 116. The second conductive type doped region 120 has an overlap region R with each of the charge storage structures 116. In addition, the second conductive type doped region 120 divides the first conductive type doped layer 102 into a plurality of first conductive type doped regions 102a that are separated from each other. The overlap region R of the second conductive type doped region 120 and each of the charge storage structures 116 needs to be sufficient for the charge storage structure 116 located in the overlap region R to function as an effective charge storage region. Moreover, on condition that a program verify condition is met, the size of the overlap region R may be decreased to reduce the second bit effect and program disturbance that are generated during operation. A ratio of a width W1 of the overlap region R of the second conductive type doped region 120 to a width W2 of the charge storage structure 116 is 1:30 to 1:5, for example. In an embodiment, the width W1 of the overlap region R is 30 to 150 Å, for example. A width W3 of the first conductive type doped region 102a is less than the width W2 of the charge storage structure 116, for example.

In addition, the second conductive type doped region 120 may be an N-type doped region or a P-type doped region. A dopant concentration of the second conductive type doped region 120 is, for example, greater than a dopant concentration of the first conductive type doped region 102a, and a dopant depth D2 of the second conductive type doped region 120 is, for example, greater than a dopant depth D1 of the first conductive type doped region 102a, so as to prevent a punch through phenomenon between the adjacent first conductive type doped regions 102a. The dopant concentration of the second conductive type doped region 120 is in a range of $2\,e^{18}$ $cm^{-3}$ to $2\,e^{21}$ $cm^{-3}$, for example. The dopant depth D2 of the second conductive type doped region 120 is in a range of 400 Å to 1100 Å, for example. A method for forming the second conductive type doped region 120 includes using the stacked structures 114 as a mask to perform an ion implantation process, for example. A method for forming the second conductive type doped region 120 in the overlap region R, for example, includes diffusing the dopant into the overlap region R by a thermal process after performing the ion implantation process or directly implanting the dopant into the overlap region R by an inclined-angle ion implantation process. In this embodiment, the second conductive type doped region 120 is the P-type doped region, for example, and the dopant used in this embodiment is a P-type dopant, such as B, $BF_2$, or In.

In this embodiment, the second conductive type doped region 120 is formed after forming the dielectric layer 118. However, the scope of the invention is not limited thereto. In other embodiments, the second conductive type doped region 120 may also be formed before forming the dielectric layer 118. Since persons skilled in the art can easily carry out the fabrication process with reference to the above embodiments, detailed descriptions are omitted hereinafter.

Figure 1E:
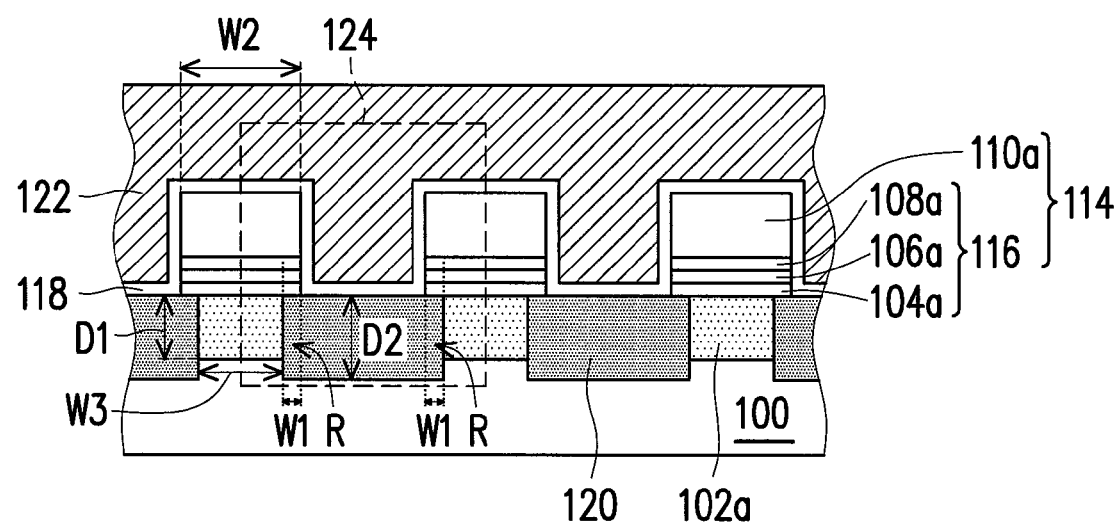

Next, referring to FIG. 1E, a conductive layer 122 is formed on the dielectric layer 118. A material of the conductive layer 122 is doped polysilicon or metal, for example. A method for forming the conductive layer 122 is, for example, a chemical vapor deposition method.

It can be known from the above embodiments that, in the non-volatile memory structure, the charge storage structures 116 used for storing charges are located at two sides of the second conductive type doped region 120 and are separated from each other, and most of the programmed charge distribution is restricted within the charge storage structures 116 in the overlap region R. Consequently, the second bit effect and program disturbance that are generated during operation may be reduced. Hence, the fabricating method, disclosed in the above embodiments, is applicable to fabricating a non-volatile memory that has better performance and reliability.

Hereinafter, a memory structure according to an embodiment of the invention is described with reference to FIG. 1E.

The non-volatile memory structure includes the substrate 100, the plurality of stacked structures 114, the plurality of first conductive type doped regions 102a, at least one second conductive type doped region 120, the conductive layer 122, and the dielectric layer 118. The stacked structures 114 are disposed on the substrate 100. Each of the stacked structures 114 includes the charge storage structure 116 and may further include the hard mask layer 110a disposed on the charge storage structure 116. Each of the charge storage structures 116 includes the dielectric layer 104a, the charge trapping layer 106a, and the dielectric layer 108a, which are sequentially arranged from the substrate 100. The first conductive type doped regions 102a are disposed in the substrate 100 under the corresponding charge storage structures 116 respectively. The second conductive type doped region 120 is disposed in the substrate 100 between the adjacent charge storage structures 116 and has the overlap region R with each of the charge storage structures 116. The conductive layer 122 covers the second conductive type doped region 120 and may further cover the stacked structures 114. The dielectric layer 118 is disposed between the conductive layer 122 and the second conductive type doped region 120 and may be further disposed between the stacked structures 114 and the conductive layer 122. The materials, forming methods, proportions, and efficiency of the elements of the non-volatile memory structure have been described in detail in the above embodiments and thus shall not be repeated hereinafter.

In a memory cell 124, the second conductive type doped region 120 may serve as a channel region. The first conductive type doped regions 102a located at two sides of the second conductive type doped region 120 may serve as a source region or a drain region. The charge trapping layers 106a in the charge storage structures 116 located at two sides of the second conductive type doped region 120 may be used for trapping charges and form a first bit and a second bit of the memory cell 124.

It can be known from the above embodiments that, when performing a programming operation on the memory cell 124, charges from the first conductive type doped region 102a at one side of the second conductive type doped region 120 are injected into the charge storage structure 116 at the other side of the second conductive type doped region 120 through the channel formed by the second conductive type doped region 120. In the memory cell 124, the charge storage structures 116 used for storing charges are located at two sides of the second conductive type doped region 120 and are separated from each other, and most of the programmed charge distribution is restricted within the charge storage structures 116 in the overlap region R. Consequently, the non-volatile memory structure disclosed in the embodiments can be conducive to reducing the second bit effect and program disturbance that are generated during operation. In addition, although the programming charges may be injected into the charge storage structures 116 above the first conductive type doped regions 102a, the charges in the charge storage structures 116 above the first conductive type doped regions 102a do not cause an initiation voltage (Vt) of a reading operation to vary and thus do not worsen the second bit effect.

To conclude the above, the above embodiments at least have the following characteristics. The non-volatile memory structure disclosed in the above embodiments can be conducive to reducing the second bit effect and program disturbance that are generated during operation. Moreover, the fabricating method of the non-volatile memory structure disclosed in the above embodiments is applicable to fabricating a non-volatile memory that has better performance and reliability.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A fabricating method of a non-volatile memory structure, comprising:
    forming a first conductive type doped layer in a substrate;
    forming a plurality of stacked structures on the substrate, and each of the stacked structures comprising a charge storage structure;
    forming a first dielectric layer on the substrate between the adjacent stacked structures;
    forming a second conductive type doped region in the substrate between the adjacent charge storage structures, the second conductive type doped region comprising an overlap region with each of the charge storage structures, and the second conductive type doped region dividing the first conductive type doped layer into a plurality of first conductive type doped regions that are separated from each other; and
    forming a conductive layer on the first dielectric layer.

2. The fabricating method according to claim 1, wherein a method for forming the stacked structures comprises:
    forming a second dielectric material layer, a charge trapping material layer, and a third dielectric material layer sequentially on the substrate; and
    performing a patterning process on the third dielectric material layer, the charge trapping material layer, and the second dielectric material layer.

3. The fabricating method according to claim 2, wherein the method for forming the stacked structures further comprises:
    forming a hard mask material layer on the third dielectric material layer; and
    performing the patterning process on the hard mask material layer.

4. The fabricating method according to claim 1, wherein a width of each of the first conductive type doped regions is less than a width of each of the charge storage structures.

5. The fabricating method according to claim 1, wherein a dopant concentration of the second conductive type doped region is greater than a dopant concentration of the first conductive type doped region.

6. The fabricating method according to claim 1, wherein a dopant depth of the second conductive type doped region is greater than a dopant depth of the first conductive type doped region.

7. The fabricating method according to claim 1, wherein a ratio of a width of each of the overlap regions to a width of each of the charge storage structures is in a range of 1:30 to 1:5.

8. The fabricating method according to claim 1, wherein a width of each of the overlap regions is 30 to 150 Å.

9. The fabricating method according to claim 1, wherein the first dielectric layer covers the stacked structures.

10. The fabricating method according to claim 1, wherein the second conductive type doped region is formed after or before forming the first dielectric layer.

* * * * *